US012610637B2

(12) United States Patent
Geng et al.

(10) Patent No.: US 12,610,637 B2
(45) Date of Patent: Apr. 21, 2026

(54) TEXTURE RECOGNITION MODULE AND DISPLAY DEVICE

(71) Applicants: BEIJING BOE SENSOR TECHNOLOGY CO., LTD., Beijing (CN); BOE TECHNOLOGY GROUP CO., LTD., Beijing (CN)

(72) Inventors: Yue Geng, Beijing (CN); Cheng Li, Beijing (CN); Zhonghuan Li, Beijing (CN); Chaoyang Qi, Beijing (CN); Yi Dai, Beijing (CN); Zefei Li, Beijing (CN)

(73) Assignees: BEIJING BOE SENSOR TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 392 days.

(21) Appl. No.: 18/254,203

(22) PCT Filed: May 30, 2022

(86) PCT No.: PCT/CN2022/095844
§ 371 (c)(1),
(2) Date: May 24, 2023

(87) PCT Pub. No.: WO2023/230742
PCT Pub. Date: Dec. 7, 2023

(65) Prior Publication Data
US 2024/0355844 A1     Oct. 24, 2024

(51) Int. Cl.
*H10F 39/00*     (2025.01)
*G06V 40/13*     (2022.01)
(Continued)

(52) U.S. Cl.
CPC ....... *H10F 39/804* (2025.01); *G06V 40/1318* (2022.01); *H01L 23/552* (2013.01); *H10F 39/18* (2025.01); *H10F 39/802* (2025.01)

(58) Field of Classification Search
CPC ...... H10F 39/804; H10F 39/18; H10F 39/802; H10F 55/00; G06V 40/1318; H01L 23/552; G06F 18/00
See application file for complete search history.

(56) References Cited

U.S. PATENT DOCUMENTS

2016/0379036 A1     12/2016  Long
2019/0213379 A1*     7/2019  Zhao ..................... H10K 50/865
(Continued)

FOREIGN PATENT DOCUMENTS

CN          107358216 A     11/2017
CN          107451554 A     12/2017
(Continued)

OTHER PUBLICATIONS

International Search report of PCT/CN2022/095844 which was mailed on Jan. 18, 2023.

*Primary Examiner* — Jonathan Han
(74) *Attorney, Agent, or Firm* — Dilworth & Barrese, LLP.; Michael J. Musella, Esq.

(57)          ABSTRACT
A texture recognition module and a display device, the texture recognition module includes a texture recognition substrate including a texture acquisition region and a peripheral region at least partially surrounding the texture acquisition region, and the texture recognition substrate includes a base substrate, multiple photosensitive sub-pixels, an optical module layer and a support layer, the multiple photosensitive sub-pixels are arranged on the base substrate and located in the texture acquisition region, each photosensitive sub-pixel includes a photosensitive element and for texture acquisition, the optical module layer is arranged on a side of the multiple photosensitive sub-pixels away from the base substrate and configured to adjust light transmis-
(Continued)

sion, and the support layer is arranged on a side of the optical module layer away from the base substrate and includes an acquisition opening which exposes the multiple photosensitive sub-pixels. The texture recognition module has a better stability.

19 Claims, 10 Drawing Sheets

(51) Int. Cl.
  *H01L 23/552* (2006.01)
  *H10F 39/18* (2025.01)

(56) References Cited

U.S. PATENT DOCUMENTS

| | | | |
|---|---|---|---|
| 2020/0184179 | A1 | 6/2020 | Hai et al. |
| 2021/0020710 | A1* | 1/2021 | Park ....................... H10K 59/88 |
| 2022/0261586 | A1* | 8/2022 | Kim ....................... G06V 40/40 |
| 2023/0109429 | A1 | 4/2023 | Wang et al. |

FOREIGN PATENT DOCUMENTS

| | | |
|---|---|---|
| CN | 108288681 A | 7/2018 |
| CN | 109598248 A | 4/2019 |
| CN | 109784262 A | 5/2019 |
| CN | 110036396 A | 7/2019 |
| CN | 209543392 U | 10/2019 |
| CN | 209640613 U | 11/2019 |
| CN | 210038815 U | 2/2020 |
| CN | 210166798 U | 3/2020 |
| CN | 111213152 A | 5/2020 |
| CN | 111273734 A | 6/2020 |
| CN | 211718906 U | 10/2020 |
| CN | 113169245 A | 7/2021 |

* cited by examiner

TEXTURE RECOGNITION MODULE AND DISPLAY DEVICE

TECHNICAL FIELD

At least one embodiment of the present disclosure relates to a texture recognition module and a display device.

BACKGROUND

Due to the uniqueness of skin textures such as fingerprint patterns or palmprint patterns, a texture recognition technology combined with optical imaging is gradually adopted by various electronic products for functions such as identity verification and electronic payment. Display screens of current electronic products, such as mobile phones and tablet computers, are developing towards larger screens and full screens, in this regard, how to design a more optimized texture recognition module and how to combine the texture recognition module with a display substrate, to improve a user's texture recognition experience is a focus of attention in this field.

SUMMARY

At least one embodiment of the present disclosure provides a texture recognition module, the texture recognition module comprises a texture recognition substrate, the texture recognition substrate comprises a texture acquisition region and a peripheral region at least partially surrounding the texture acquisition region, and the texture recognition substrate comprises a base substrate, a plurality of photosensitive sub-pixels, an optical module layer and a support layer, the plurality of photosensitive sub-pixels are arranged on the base substrate and located in the texture acquisition region, each of the plurality of photosensitive sub-pixels comprises a photosensitive element, and being used for texture acquisition, the optical module layer is arranged on a side of the plurality of photosensitive sub-pixels away from the base substrate and configured to adjust light transmission, and the support layer is arranged on a side of the optical module layer away from the base substrate and comprises an acquisition opening, and the acquisition opening exposes the plurality of photosensitive sub-pixels.

For example, in the texture recognition module provided by at least one embodiment of the present disclosure, the peripheral region comprises a dummy sub-pixel region at least partially surrounding the texture acquisition region, the texture recognition substrate further comprises a plurality of dummy sub-pixels arranged on the base substrate and located in the dummy sub-pixel region, and orthographic projections of the plurality of dummy sub-pixels on the base substrate are located within an orthographic projection of the support layer on the base substrate.

For example, in the texture recognition module provided by at least one embodiment of the present disclosure, the orthographic projections of the plurality of dummy sub-pixels on the base substrate are located within an orthographic projection of the optical module layer on the base substrate.

For example, in the texture recognition module provided by at least one embodiment of the present disclosure, a cutting dimension tolerance of the optical module layer in a length direction of the base substrate is $\pm\delta_{H\text{-}lens}$, and a cutting dimension tolerance in a width direction of the base substrate is $\pm\delta_{V\text{-}lens}$, $\delta_{H\text{-}lens}=\delta_{V\text{-}lens}=\delta 1$; an attachment position tolerance of the optical module layer in the length direction of the base substrate is $\pm\Delta_{H\text{-}lens}$, and an attachment position tolerance of the optical module layer in the width direction of the base substrate is $\pm\Delta_{V\text{-}lens}$, $\Delta_{H\text{-}lens}=\Delta_{V\text{-}lens}=\Delta 1$, and a distance between an edge of an orthographic projection of the dummy sub-pixel region on the base substrate and an edge of the orthographic projection of the optical module layer on the base substrate is $OL_{lens}$, then:

$$OL_{lens} \geq \sqrt{\delta 1^2 + \Delta 1^2}.$$

For example, in the texture recognition module provided by at least one embodiment of the present disclosure, a total length of the texture acquisition region and the dummy sub-pixel region is $H_{AA+dummy}$, a total width of the texture acquisition region and the dummy sub-pixel region is $V_{AA+dummy}$, a length of the optical module layer is $H_{lens}$, and a width of the optical module layer is $V_{lens}$, then $$H_{lens} \geq H_{AA+dummy} + 2\sqrt{\delta 1^2 + \Delta 1^2},$$

$$V_{lens} \geq H_{AA+dummy} + 2\sqrt{\delta 1^2 + \Delta 1^2}.$$

For example, in the texture recognition module provided by at least one embodiment of the present disclosure, an edge of an orthographic projection of the optical module layer on the base substrate is located within an orthographic projection of the support layer on the base substrate.

For example, in the texture recognition module provided by at least one embodiment of the present disclosure, in a direction perpendicular to the base substrate, the support layer has a thickness of 200 microns to 500 microns.

For example, in the texture recognition module provided by at least one embodiment of the present disclosure, an edge of the support layer is at least partially flush with an edge of the base substrate; or an edge of the support layer extends beyond an edge of the base substrate.

For example, in the texture recognition module provided by at least one embodiment of the present disclosure, the peripheral region further comprises a circuit bonding region located on a side of the dummy sub-pixel region away from the texture acquisition region, the texture recognition module further comprises a chip-on-film and an electromagnetic shielding layer; the chip-on-film comprises a first bonding end, the first bonding end is bonded to the circuit bonding region, the electromagnetic shielding layer is arranged on a side of the chip-on-film far away from the base substrate, an orthographic projection of at least the first bonding end of the chip-on-film on the base substrate is located within an orthographic projection of the electromagnetic shielding layer on the base substrate.

For example, in the texture recognition module provided by at least one embodiment of the present disclosure, the circuit bonding region comprises a first circuit bonding region located on a first side of the dummy sub-pixel region and a second circuit bonding region located on a second side of the dummy sub-pixel region, the chip-on-film comprises a scanning driving chip-on-film and a reading circuit chip-on-film, a first bonding end of the reading circuit chip-on-film is bonded to the first circuit bonding region, and a first bonding end of the scanning driving chip-on-film is bonded to the second circuit bonding region.

For example, in the texture recognition module provided by at least one embodiment of the present disclosure, the first side and the second side are adjacent to each other.

For example, in the texture recognition module provided by at least one embodiment of the present disclosure, a gap is provided between an edge of the electromagnetic shielding layer and an edge of the base substrate adjacent to the electromagnetic shielding layer.

For example, in the texture recognition module provided by at least one embodiment of the present disclosure, a cutting dimension tolerance of the electromagnetic shielding layer in a length direction of the base substrate is $\pm\delta_{H\text{-}EMI}$, the cutting dimension tolerance in a width direction of the base substrate is $\pm\delta_{V\text{-}EMI}$, $\delta_{H\text{-}EMI}=\delta_{V\text{-}EMI}=\delta2$; an attachment position tolerance of the electromagnetic shielding layer in the length direction of the base substrate is $\pm\Delta_{H\text{-}EMI}$, an attachment position tolerance in the width direction of the base substrate is $\pm\Delta_{V\text{-}EMI}$, $\Delta_{H\text{-}EMI}=\Delta_{V\text{-}EMI}=\Delta2$; a distance between an edge of the electromagnetic shielding layer and an edge of the adjacent base substrate in the length direction and the width direction is $OL_{EMI}$ respectively, then $$OL_{EMI} \geq \sqrt{\delta2^2 + \Delta2^2}.$$

For example, in the texture recognition module provided by at least one embodiment of the present disclosure, at least a portion of an edge of the electromagnetic shielding layer is flush with an edge of the base substrate.

For example, in the texture recognition module provided by at least one embodiment of the present disclosure, a gap is provided between the electromagnetic shielding layer and the adjacent optical module layer, and a distance of the gap is $Gap_{EMI}$, then:

$$Gap_{EMI} \geq \sqrt{\delta1^2 + \Delta1^2 + \delta2^2 + \Delta2^2}.$$

For example, in the texture recognition module provided by at least one embodiment of the present disclosure, in a direction perpendicular to the base substrate, a thickness of the electromagnetic shielding layer is 10 microns to 50 microns.

For example, in the texture recognition module provided by at least one embodiment of the present disclosure, a gap is provided between the electromagnetic shielding layer and the support layer.

For example, in the texture recognition module provided by at least one embodiment of the present disclosure, a cutting dimension tolerance of the support layer in a length direction of the base substrate is $\pm\delta_{H\text{-}SCF}$, a cutting dimension tolerance of the support layer in a width direction of the base substrate is $\pm\delta_{V\text{-}SCF}$, $\delta_{H\text{-}SCF}=\delta_{V\text{-}SCF}=\delta3$; an attachment position tolerance of the support layer in the length direction of the base substrate is $\pm\Delta_{H\text{-}SCF}$, an attachment position tolerance of the support layer in the width direction of the base substrate is $\pm\Delta_{V\text{-}SCF}$, $\Delta_{H\text{-}SCF}=\Delta_{V\text{-}SCF}=\Delta3$; and a distance of a gap between the electromagnetic shielding layer and the support layer is $Gap_{SCF}$, then:

$$Gap_{SCF} \geq \sqrt{\delta2^2 + \Delta2^2 + \delta3^2 + \Delta3^2}.$$

For example, the texture recognition module provided by at least one embodiment of the present disclosure further comprises a first adhesive layer which is arranged on a side of the base substrate away from the plurality of photosensitive sub-pixels.

For example, in the texture recognition module provided by at least one embodiment of the present disclosure, at least a portion of an edge of the first adhesive layer is flush with an edge of the base substrate.

For example, in the texture recognition module provided by at least one embodiment of the present disclosure, the chip-on-film comprises a control chip, the first adhesive layer further extends to an edge of the chip-on-film to at least partially surround the control chip.

For example, the texture recognition module provided by at least one embodiment of the present disclosure further comprises a circuit board, the circuit board comprises a third bonding end, the third bonding end is bonded to a second bonding end of the reading circuit chip-on-film opposite to the first bonding end.

For example, in the texture recognition module provided by at least one embodiment of the present disclosure, the circuit board comprises a first substrate, and the third bonding end comprises a bonding pin arranged on the first substrate; the texture recognition module further comprises a second adhesive layer arranged on a side of the first substrate away from the bonding pin, and in a direction perpendicular to the first substrate, the bonding pin is at least partially overlapped with the second adhesive layer.

For example, in the texture recognition module provided by at least one embodiment of the present disclosure, the circuit board further comprises a reinforcing sheet that is arranged on a side of the first substrate away from the bonding pin and located at an edge of the circuit board and a third adhesive layer arranged on a side of the reinforcing sheet away from the first substrate.

For example, in the texture recognition module provided by at least one embodiment of the present disclosure, at least a portion of an edge of the third adhesive layer is flush with an edge of the reinforcing sheet.

For example, in the texture recognition module provided by at least one embodiment of the present disclosure, a gap is provided between the second adhesive layer and the third adhesive layer, and a distance of the gap is greater than or equal to 2 mm.

For example, in the texture recognition module provided by at least one embodiment of the present disclosure, in a direction perpendicular to the first substrate, a thickness of the second adhesive layer and a thickness of the third adhesive layer are from 50 microns to 500 microns respectively.

For example, in the texture recognition module provided by at least one embodiment of the present disclosure, the reading circuit chip-on-film comprises a second substrate, a reading circuit control chip and a chip supporting layer; the reading circuit control chip is arranged on the second substrate and located between the first bonding end and the second bonding end, the chip supporting layer is arranged on the second substrate and at least partially surrounding the readout circuit control chip.

For example, in the texture recognition module provided by at least one embodiment of the present disclosure, a first height of the chip supporting layer relative to the second substrate is greater than a second height of the reading circuit control chip relative to the second substrate, and a difference between the first height and the second height is from 50 microns to 200 microns.

At least one embodiment of the present disclosure provides a display device, the display device comprises a texture recognition module provided by embodiments of the present disclosure and a display substrate, the display substrate is arranged on a side of the support layer of the texture recognition module away from the base substrate.

For example, the display device provided by at least one embodiment of the present disclosure further comprises a middle frame, and the middle frame is arranged on a side of the base substrate of the texture recognition module away from the support layer.

BRIEF DESCRIPTION OF THE DRAWINGS

In order to clearly illustrate the technical solution of the embodiments of the present disclosure, the drawings of the embodiments will be briefly described. It is obvious that the described drawings in the following are only related to some embodiments of the present disclosure and thus are not construed as any limitation to the present disclosure.

DETAILED DESCRIPTION

Figures 1A, 1B:
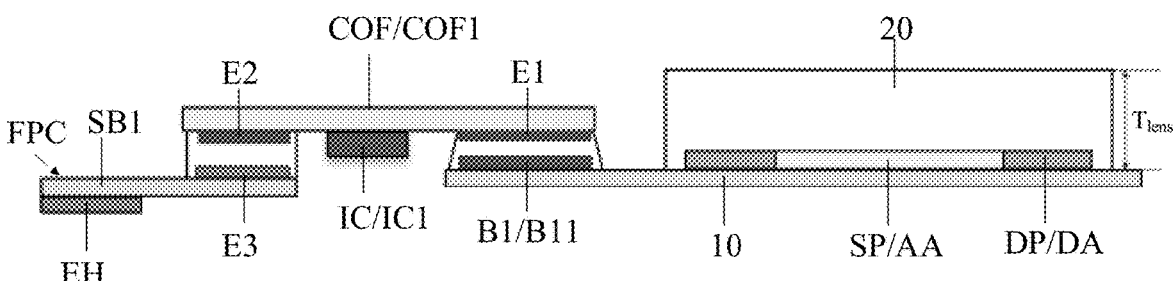
FIG. 1A is a planar schematic diagram of a texture recognition module provided by at least one embodiment of the present disclosure.
FIG. 1B is a cross-sectional schematic diagram along a line A-A of the texture recognition module in FIG. 1A.

In order to make objectives, technical details, and advantages of the embodiments of the present disclosure more clear, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first", "second", etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the described object is changed, the relative position relationship may be changed accordingly.

In electronic products such as mobile phones and tablet computers, texture recognition modules with texture recognition function are usually combined, the texture recognition modules may be combined on the display substrates of the electronic products, or may be integrated in the display substrates of electronic products, to realize the texture recognition function while displaying. In a case that the texture recognition modules are combined as independent modules on the display substrates of the electronic products, combination structures and manners of the texture recognition modules and the display substrates are important factors that affect the texture recognition functions and thicknesses of the electronic products.

For example, in a case that an electronic product is assembled, a space in a thickness direction of the electronic product is limited, thus a distance between a surface of the texture recognition module and a surface of the display substrate is very small, usually less than 300 microns, within this distance range, on the one hand, the display substrate and the texture recognition module are prone to electromagnetic interference, which will bring a lot of noise to the texture recognition; on the other hand, a material of a lens structure on a surface of the optical modulation film of the texture recognition module is relatively fragile, and frequent impacts will damage the lens structure or change its focal length, resulting in blurred texture image or no-texture images; on the other hand, due to the reflection of structures such as a middle frame of electronic products, some unnecessary interfering light may be reflected into the texture recognition module, affecting the texture recognition effect of the texture recognition module. The above phenomena significantly reduce the quality of texture imaging and the accuracy of texture recognition.

At least one embodiment of the present disclosure provides a texture recognition module, the texture recognition module includes a texture recognition substrate, the texture recognition substrate has a texture acquisition region and a peripheral region at least partially surrounding the texture acquisition region, and includes a base substrate, a plurality of photosensitive sub-pixels, an optical module layer and a support layer, the plurality of photosensitive sub-pixels are arranged on the base substrate and located in the texture acquisition region, each of the plurality of photosensitive sub-pixels includes a photosensitive element, which is used for texture acquisition, the optical module layer is arranged on the side of the plurality of photosensitive sub-pixels away from the base substrate, and is configured to adjust the transmission of light, the support layer is arranged on a side of the optical module layer away from the base substrate, and the support layer includes an acquisition opening exposing the plurality of photosensitive sub-pixels.

In the above-mentioned texture recognition module provided by the embodiments of the present disclosure, the optical module layer may adjust (such as collimate, filter, etc.) signal light for texture recognition that is incident in the optical module layer, further, the signal light which is incident into the plurality of photosensitive sub-pixels in the texture acquisition region is more sufficient; the support layer is arranged on the optical module layer, and can provide protection for the plurality of photosensitive sub-pixels and the optical module layer, in a case that the texture recognition module is combined on the display substrate, the support layer may be sandwiched between the display substrate and the optical module layer, in this way, in a case that a user operates the display substrate, the support layer can buffer the force of the display substrate to avoid damage to the optical module layer and the plurality of photosensitive sub-pixels, in this way, the integrity and reliability of the texture recognition module are improved.

In the following, the texture recognition module and the display device provided by the embodiments of the present disclosure will be described in detail through several specific embodiments.

At least one embodiment of the present disclosure provides a texture recognition module. FIG. 1A shows a planar schematic diagram of the texture recognition module, and FIG. 1B shows a schematic diagram of a cross-section of the texture recognition module in FIG. 1A along a line A-A. As shown in FIG. 1A and FIG. 1B, the texture recognition module includes a texture recognition substrate, the texture recognition substrate has a texture acquisition region AA and a peripheral region NA at least partially surrounding the texture acquisition region AA (that is, the peripheral region NA is a region other than the texture acquisition region AA), and includes structures such as a base substrate 10, a plurality of photosensitive sub-pixels SP, and an optical module layer 20.

As shown in FIG. 1A and FIG. 1B, a plurality of photosensitive sub-pixels SP are arranged on the base substrate 10, and are located in the texture acquisition region AA, each of the plurality of photosensitive sub-pixels SP includes a photosensitive element SPE for texture acquisition, and further includes a driving circuit for driving the photosensitive element SPE (details will be described later). The optical module layer 20 is arranged on a side of the plurality of photosensitive sub-pixels SP away from the base substrate 10 and is configured to adjust light transmission.

For example, the base substrate 10 may include a flexible insulating material such as polyimide (PI) or a rigid insulating material such as a glass substrate. The photosensitive element SPE may be a photodiode, for example, the photodiode may be a PN type or a PIN type. For example, in a case that the photodiode is a PN type, the photosensitive element P includes a P-type semiconductor layer and an N-type semiconductor layer that are stacked; in a case that the photodiode is a PIN type, the photosensitive element P includes a P-type semiconductor layer, an intrinsic semiconductor layer and an N-type semiconductor layer that are stacked. For example, the semiconductor material used by the photosensitive element SPE may be silicon, germanium, selenium or gallium arsenide, which is not limited in the embodiments of the present disclosure.

For example, in some embodiments, the driving circuit for driving the photosensitive element SPE may have a 2T1C structure, a 3T1C structure, or a 3T2C structure. For example, the driving circuit with a 3T1C structure includes three thin film transistors, a storage capacitor, and lines such as signal scanning signal lines and signal readout lines connected with the thin film transistors and the storage capacitor. Embodiments of the present disclosure do not limit the specific form of the driving circuit.

For example, in some embodiments, the optical module layer 20 includes one or more of an aperture layer, a lens layer, and a filter layer. For example, the number of the aperture layer may be one or more, and each aperture layer includes a plurality of light-transmitting holes for collimating light, so that the direction of light propagation is within a predetermined range. For example, the lens layer includes a plurality of lens units corresponding to the plurality of photosensitive sub-pixels SP, to generate a converging effect on the signal light for each of the photosensitive sub-pixels SP. For example, the filter layer may filter out light in unwanted wavelength ranges, for example, in some examples, the filter layer is configured to transmit light having a wavelength of 580 nm to 850 nm.

For example, in some embodiments, as shown in FIG. 1A and FIG. 1B, the peripheral region NA includes a dummy sub-pixel region DA at least partially surrounding the texture acquisition region AA, the texture recognition substrate further includes a plurality of dummy sub-pixels DP arranged on the base substrate 10 and located in the dummy sub-pixel region DA. For example, each of the plurality of dummy sub-pixels DP further includes a photosensitive element and a driving circuit for driving the photosensitive element. For example, structures and circuit connection relationships of the dummy sub-pixels DP and the photosensitive sub-pixels SP are the same, however, the dummy sub-pixels DP are blocked, for example, the dummy sub-pixels DP are blocked by the support layer SCF (detailed later) or other light-shielding structures, so that it is ensured that the signals collected by the dummy sub-pixels DP are completely dark state signals, that is, the signals are not affected by external light reflection and refraction, and does not participate in the texture recognition operation. In the embodiments of the present disclosure, the arrangement of the dummy sub-pixels DP can realize row noise reduction, and the texture recognition accuracy of the photosensitive sub-pixels SP in the texture acquisition region AA is improved.

For example, orthographic projections of the plurality of dummy sub-pixels DP on the base substrate 10 are located in an orthographic projection of the optical module layer 20 on the base substrate 10. That is, the optical module layer 20 is further covered above the plurality of dummy sub-pixels DP, so that the plurality of dummy sub-pixels DP and the plurality of photosensitive sub-pixels SP are in substantially the same environment.

For example, in some embodiments, a cutting dimension tolerance of the optical module layer 20 in a length direction of the base substrate 10 (the horizontal direction in FIG. 1A) is $\pm\delta_{H-lens}$, a cutting dimension tolerance in a width direction of the base substrate 10 (the vertical direction in FIG. 1A) is $\pm\delta_{V-lens}$, $\delta_{H-lens}=\delta_{V-lens}=\delta1$; an attachment position tolerance of the optical module layer 20 in the length direction of the base substrate 10 is $\Delta_{H-lens}$, an attachment position tolerance in the width direction of the base substrate 10 is $\Delta_{V-lens}$, $\Delta_{H-lens}=\Delta_{V-lens}=\Delta1$, a distance between an edge of the orthographic projection of the dummy sub-pixel region DA on the base substrate 10 and an edge of the orthographic projection of the optical module layer 20 on the base substrate 10 is $OL_{lens}$, then $$OL_{lens} \geq \sqrt{\delta1^2 + \Delta1^2}.$$

For example, in some embodiments, the range of $\delta1$ and $\Delta1$ is from 0.05 mm to 0.50 mm, such as 0.10 mm, 0.20 mm, 0.30 mm or 0.40 mm and so on.

For example, the distance $OL_{lens}$ between the edge of the orthographic projection of the dummy sub-pixel region DA on the base substrate 10 and the edge of the orthographic projection of the optical module layer 20 on the base substrate 10 in the four directions of up, down, left, and right in FIG. 1A all meet the above conditions.

For example, as shown in FIG. 1A, a total length of the texture acquisition region AA and the dummy sub-pixel region DA is $H_{AA+dummy}$, a total width of the texture acquisition region AA and the dummy sub-pixel region DA is $V_{AA+dummy}$, a length of the optical module layer 20 is $H_{lens}$, and a width of the optical module layer 20 is $V_{lens}$, then:

$$H_{lens} \geq H_{AA+dummy} + 2\sqrt{\delta1^2 + \Delta1^2},$$

$$V_{lens} \geq H_{AA+dummy} + 2\sqrt{\delta1^2 + \Delta1^2}.$$

In this way, it can be ensured that the optical module layer 20 completely covers the texture acquisition region AA and the dummy sub-pixel region DA.

Figures 2A, 2B:
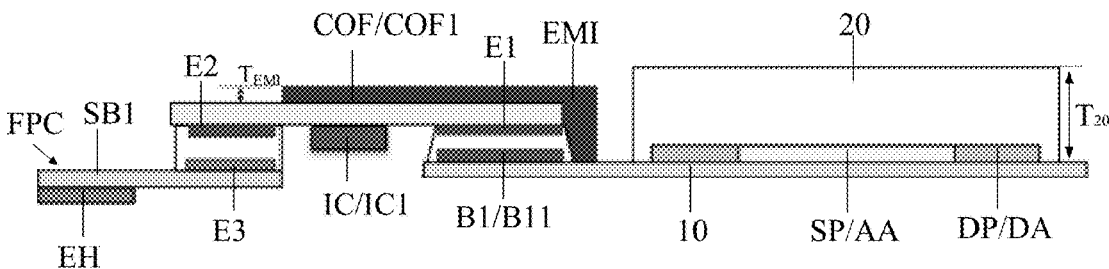
FIG. 2A is a planar schematic diagram of another texture recognition module provided by at least one embodiment of the present disclosure.
FIG. 2B is a cross-sectional schematic diagram along a line A-A of the texture recognition module in FIG. 2A.

For example, in some embodiments, as shown in FIG. 2B, a thickness T20 of the optical module layer 20 may be from 50 microns to 200 microns, such as 80 microns, 100 microns or 150 microns. For example, in some examples, an adhesive layer (not shown in the figure) may also be attached to a side of the optical module layer 20 close to the base substrate 10, to be convenient for bonding with the texture acquisition region AA and the base substrate 10, for example, a thickness of the adhesive layer may be from 10 microns to 50 microns, such as 20 microns, 30 microns or 40 microns and so on.

For example, in some embodiments, as shown in FIG. 1A and FIG. 1B, the peripheral region DA further includes a circuit bonding region DC located on a side of the dummy sub-pixel region DA away from the texture acquisition region AA, the texture recognition module further includes a chip-on-film COF, and the chip-on-film COF includes a control chip IC and a connection circuit (such as a connection line) and other structures, the chip-on-film COF has a first bonding end B1, and the first bonding end B1 is bonded to the circuit bonding region DC, so that a driving signal is provided for the photosensitive elements SPE of the photosensitive sub-pixels SP in the texture acquisition region AA.

FIG. 2A shows a planar schematic diagram of another texture recognition module provided by at least one embodiment of the present disclosure, and FIG. 2B shows a schematic diagram of a cross-section of the texture recognition module in FIG. 2A along a line A-A. As shown in FIG. 2A and FIG. 2B, in some embodiments, the texture recognition module further includes an electromagnetic shielding layer EMI, the electromagnetic shielding layer EMI is arranged on the side of the chip-on-film COF away from the base substrate 101, and an orthographic projection of at least the first bonding end B1 of the chip-on-film COF on the base substrate 101 is located within an orthographic projection of the electromagnetic shielding layer EMI on the base substrate 101.

For example, an orthographic projection of the control chip IC of the chip-on-film COF on the base substrate 101 is also located within an orthographic projection of the electromagnetic shielding layer EMI on the base substrate 101. In this way, the electromagnetic shielding layer EMI can provide an electromagnetic shielding effect for the chip-on-film COF, to prevent the chip-on-film COF from being interfered by signals from other circuits. For example, in a case that the texture recognition module is combined with the display substrate, since a large number of electrical signals are transmitted on the display substrate, at this time, the electromagnetic shielding layer EMI can prevent electrical signals transmitted on the display substrate from affecting normal operation of the texture recognition module, so that the accuracy of the texture recognition module is improved.

For example, in some embodiments, as shown in FIG. 1A, the circuit bonding region DC includes a first circuit bonding region DC1 located on a first side (a lower side in the figure) of the dummy sub-pixel region DA and the second circuit bonding region DC2 located on the second side (a right side in the figure) of the dummy sub-pixel region DA, the chip-on-film COF includes a scanning driving chip-on-film COF2 (Gate COF) and a reading circuit chip-on-film COF1 (Readout COF), a first bonding end B1 of the reading circuit chip-on-film COF1 is bonded to the first circuit bonding region DC1, a first bonding end B1 of the scanning driving chip-on-film COF2 is bonded to the second circuit bonding region B2. For example, the first side and the second side mentioned above are adjacent.

Figure 11:
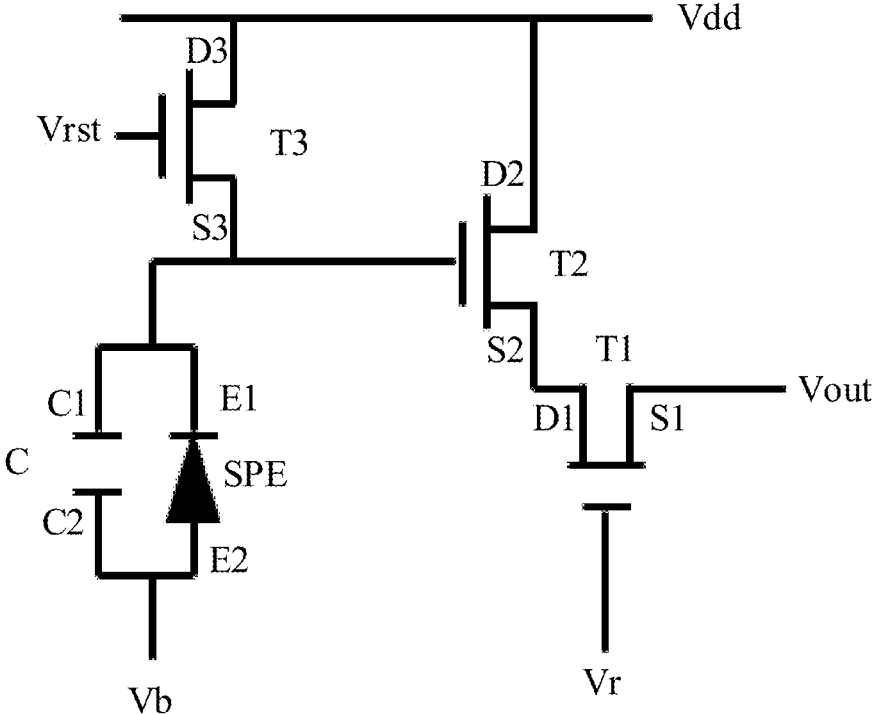
FIG. 11 is a schematic diagram of a driving circuit of a photosensitive sub-pixel of a texture recognition module provided by at least one embodiment of the present disclosure.

For example, FIG. 11 shows a schematic circuit diagram of a driving circuit, as shown in FIG. 11, the driving circuit has a 3T1C structure, the driving circuit includes a first thin film transistor T1, a second thin film transistor T2, a third thin film transistor T3 and a capacitor C.

For example, as shown in FIG. 11, the first thin film transistor T1 is used as a switch transistor, the control end of the first thin film transistor T1 is connected with the scanning signal line Vr, the first source-drain end S1 and the second source-drain end D1 are respectively connected with a signal readout line Vout and a first source-drain end S2 of the second thin film transistor T2. The second thin film transistor T2 is used as a driving transistor, the control end of the second thin film transistor T2 is connected with the first source-drain end S3 of the third thin film transistor T3, a first capacitor plate C1 of the capacitor C, and a first electrode E1 of the photosensitive element SPE, the second source-drain end D2 is connected with the power line Vdd. The third thin film transistor T3 is used as a reset transistor, and the control end of the third thin film transistor T3 is connected with the reset signal line Vrst, the second source-drain end D3 is connected with the power line Vdd. The second capacitor plate C2 of the capacitor C and the second electrode E2 of the photosensitive element SPE are connected with the bias line Vb.

For example, under the circuit shown in FIG. 11, a working process of the photosensitive element SPE includes: first, in a reset phase, a reset signal is input to the control end of the third thin film transistor T3 through the reset signal line Vrst to turn on the third thin film transistor T3, and the reset signal is written into the first electrode E1 of the photosensitive element P and the control end of the second thin film transistor T2; then, in a photosensitive stage, the photosensitive element SPE generates photogenerated carriers under the irradiation of signal light to generate photogenerated leakage current, and charges the capacitor C, so that the capacitor C is generated and the capacitor C stores electrical signals; finally, in a detection phase, a scanning signal is input to the control end of the first thin film transistor T1 through the scanning signal line Vr to turn on the first thin film transistor T1, and a texture recognition chip reads the electric signal stored in the capacitor C from the first thin film transistor T1 and the second thin film transistor T2 through the signal readout line Vout, and then a texture image is formed.

For example, the scanning driving chip-on-film COF2 is electrically connected with the scanning signal line Vr, and the scanning driving chip-on-film is used to provide a row scanning driving signal for the driving circuits of the photosensitive pixel; the reading circuit chip-on-film COF1 is electrically connected with the signal readout line Vout, and is used for acquiring and processing the readout signal. For example, in a case that the texture recognition module is combined with the display substrate, the electromagnetic shielding layer EMI on the scanning driving chip-on-film COF2 can shield a row scan frequency on the display substrate from interfering with a row scan frequency of the texture recognition module; similarly, the electromagnetic shielding layer EMI on the reading circuit chip-on-film COF1 can shield other electrical signals on the display substrate from interfering with the readout signal of the texture recognition module.

For example, in some embodiments, as shown in FIG. 2A, an edge of the electromagnetic shielding layer EMI is spaced apart from an edge of the adjacent base substrate 10, that is, a gap is provided between an edge of the electromagnetic shielding layer EMI and an edge of the corresponding base substrate 10 in a position. For example, a spacing distance between the edge of the electromagnetic shielding layer EMI and the edge of the adjacent base substrate 101 in the length direction (the horizontal direction in the figure) of the base substrate 10 is $OL_{EMI-H}$, and a spacing distance in the width direction (the vertical direction in the figure) of the base substrate 10 is $OL_{EMI-V}$, and $OL_{EMI-H}$ is basically the same as $OL_{EMI-V}$.

For example, the edge of the electromagnetic shielding layer EMI is spaced apart from the edge of the adjacent chip-on-film COF, that is, a gap is provided between the edge of the electromagnetic shielding layer EMI and the edge of the corresponding chip-on-film COF in a position. For example, the spacing distance between the edge of the electromagnetic shielding layer EMI and the edge of the chip-on-film COF in the length direction of the base substrate 10 is also $OL_{EMI-H}$, and the spacing distance in the width direction of the base substrate 10 is also $OL_{EMI-V}$.

For example, in some embodiments, the cutting dimension tolerance of the electromagnetic shielding layer EMI in the length direction of the base substrate 10 is $\pm\delta_{H-EMI}$, the cutting dimension tolerance of the electromagnetic shielding layer EMI in the width direction of the base substrate 10 is $\pm\delta_{V-EMI}$, $\delta_{H-EMI}=\delta_{V-EMI}=\delta2$. An attachment position tolerance of the electromagnetic shielding layer EMI in the length direction of the base substrate 10 is $\pm\Delta_{H-EMI}$, an attachment position tolerance of the electromagnetic shielding layer EMI in the width direction of the base substrate 10 is $\pm\Delta_{V-EMI}$, $\Delta_{H-EMI}=\Delta_{V-EMI}=\Delta2$. the spacing distances between the edge of the electromagnetic shielding layer EMI and the edge of the base substrate 10 in the length direction and the width direction are $OL_{EMI}$ respectively, $OL_{EMI}=OL_{EMI-H}=OL_{EMI-V}$, and $$OL_{EMI} \geq \sqrt{\delta2^2 + \Delta2^2}.$$

For example, in some embodiments, a range of $\delta2$ and $\Delta2$ is from 0.05 mm to 0.50 mm respectively, such as 0.10 mm, 0.20 mm, 0.30 mm or 0.40 mm and so on.

In this way, it can be ensured that the edge of the electromagnetic shielding layer EMI and the edge of the base substrate 10 have a sufficient spacing distance in the length direction and the width direction, to avoid the edge of the electromagnetic shielding layer EMI beyond the edge of the base substrate 10.

For example, as shown in FIG. 2A, the electromagnetic shielding layer EMI is spaced apart from the optical module layer 20, for example, the spacing distance in the length direction of the base substrate 10 is $Gap_{EMI-H}$, the spacing distance in the width direction of the base substrate 10 is $Gap_{EMI-V}$, for example, $Gap_{EMI-H}$ is basically the same as $Gap_{EMI-V}$. For example, the spacing distance between the electromagnetic shielding layer EMI and the optical module layer 20 is $Gap_{EMI}$, $Gap_{EMI}=Gap_{EMI-H}=Gap_{EMI-V}$, and:

$$Gap_{EMI} \geq \sqrt{\delta1^2 + \Delta1^2 + \delta2^2 + \Delta2^2}.$$

In this way, the overlapping of the electromagnetic shielding layer EMI and the optical module layer 20 can be avoided.

Figure 3:
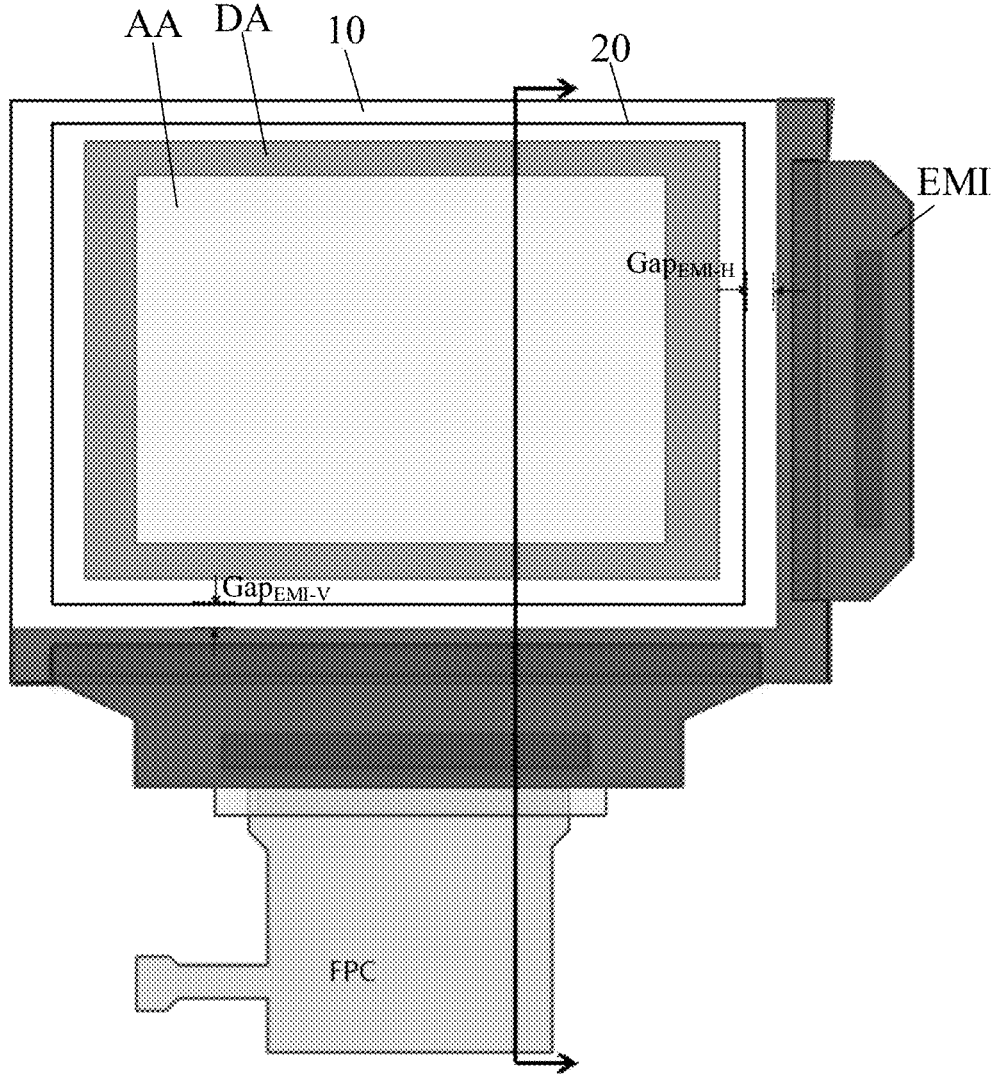
FIG. 3 is a planar schematic diagram of still another texture recognition module provided by at least one embodiment of the present disclosure.

For example, in some other embodiments, as shown in FIG. 3, at least a portion of the edge of the electromagnetic shielding layer EMI is flush with the edge of the base substrate 10. For example, at least a portion of the edge of the electromagnetic shielding layer EMI is flush with the edge of the chip-on-film COF. In this way, the electromagnetic shielding layer EMI can fully realize the electromagnetic shielding effect.

For example, in some embodiments, as shown in FIG. 2B, in a direction perpendicular to the base substrate 10, that is, in the vertical direction in the figure, the thickness $T_{EMI}$ of the electromagnetic shielding layer EMI may be from 10 microns to 50 microns, such as 20 microns, 30 microns or 40 microns. For example, the electromagnetic shielding layer EMI may be bonded with the chip-on-film COF through an adhesive layer (not shown in the figure), for example, a thickness of the adhesive layer may be from 10 microns to 30 microns, such as 15 microns, 20 microns or 25 microns.

For example, a material of the electromagnetic shielding layer may be copper, aluminum, titanium and other metal materials or alloy materials, or other suitable electromagnetic shielding materials.

Figure 4:
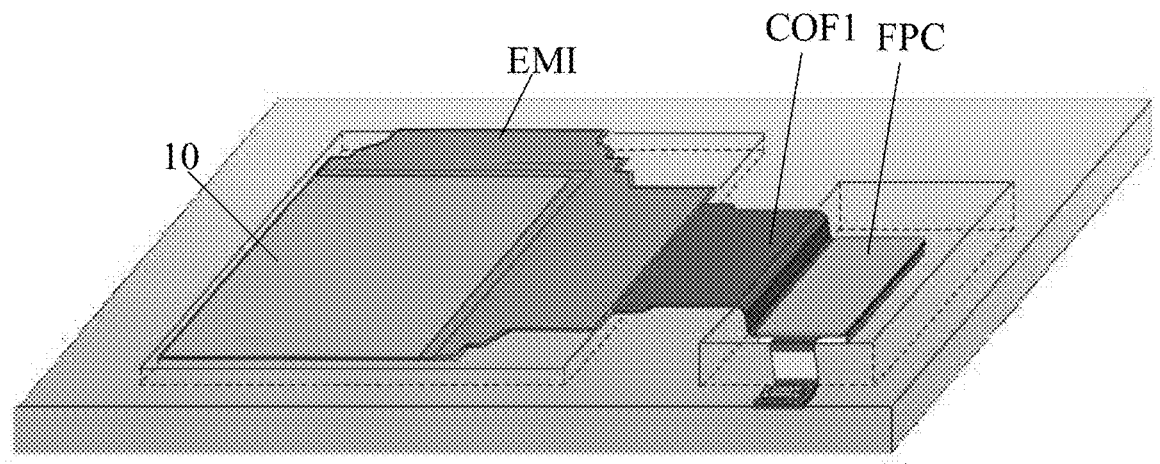
FIG. 4 a three-dimensional structure schematic diagram of a partial structure of a texture recognition module provided by at least one embodiment of the present disclosure.

For example, FIG. 4 shows a three-dimensional schematic diagram of a partial structure of the texture recognition module, in some embodiments, the chip-on-film COF is flexible, thus the chip-on-film COF can be bent, to facilitate bonding with the circuit bonding region DC and the circuit board FPC (described later) and using the circuit board FPC to bond with other structures/devices.

Figure 5A:
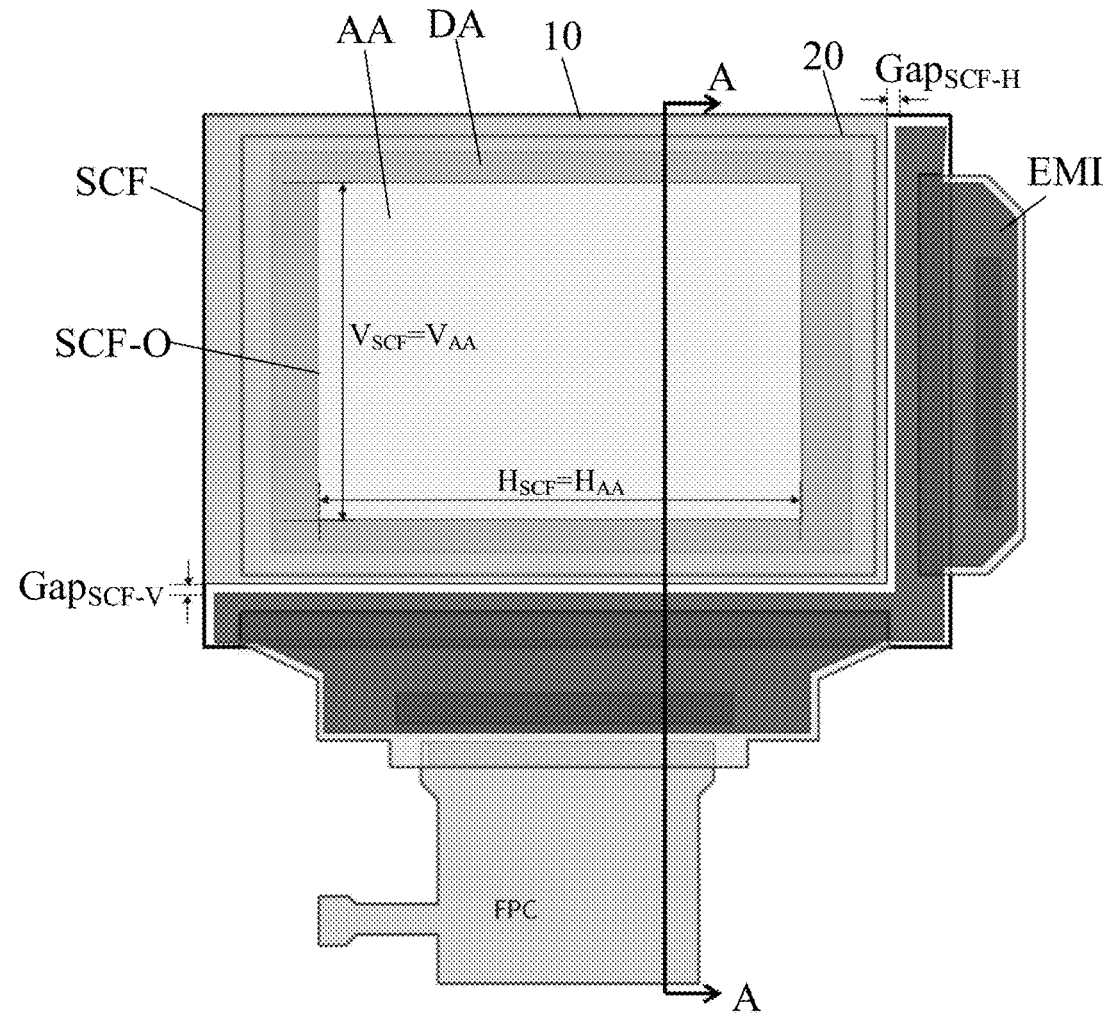
FIG. 5A is a planar schematic diagram of still another texture recognition module provided by at least one embodiment of the present disclosure.
Figure 5B:
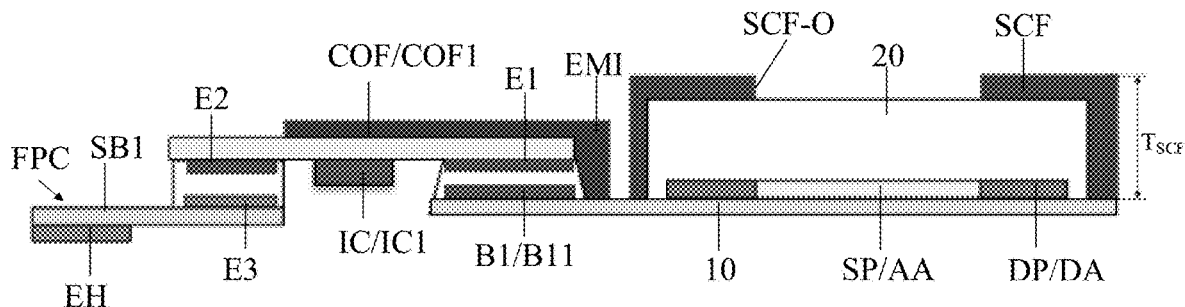
FIG. 5B is a cross-sectional schematic diagram along a line A-A of the texture recognition module in FIG. 5A.

For example, FIG. 5A shows a planar schematic diagram of another texture recognition module provided by at least one embodiment of the present disclosure, and FIG. 5B shows a schematic diagram of the cross-section of the texture recognition module in FIG. 5A along the line A-A. As shown in FIG. 5A and FIG. 5B, in some embodiments, the texture recognition module further includes a support layer SCF, the support layer SCF is arranged on the side of the optical module layer 20 away from the base substrate 10, the support layer SCF includes an acquisition opening SCF-O, the acquisition opening SCF-O exposes the plurality of photosensitive sub-pixels SP, to avoid affecting the signal light entering the plurality of photosensitive sub-pixels SP.

For example, in some embodiments, as shown in FIG. 5A, a length HscF of the acquisition opening SCF-O is equal to a length $H_{AA}$ of the texture acquisition region AA, and a width $V_{SCF}$ of the acquisition opening SCF-O is equal to a width $V_{AA}$ of the texture acquisition region AA, to fully expose the plurality of photosensitive sub-pixels SP.

For example, orthographic projections of the plurality of dummy sub-pixels DP on the base substrate 10 are located within an orthographic projection of the support layer SCF on the base substrate 10, so that the support layer SCF can completely shield the plurality of dummy sub-pixels DP to avoid light leakage.

For example, in some embodiments, an edge of the orthographic projection of the optical module layer 20 on the base substrate 10 is located within the orthographic projection of the support layer SCF on the base substrate 10. That is, as shown in FIG. 5A and FIG. 5B, the edge of the optical module layer 20 is completely covered by the support layer SCF, and the edge of the optical module layer 20 is supported and protected by the support layer SCF.

In the embodiments of the present disclosure, the support layer SCF can provide protection for the plurality of photosensitive sub-pixels SP and the optical module layer 20, in a case that the texture recognition module is combined on the display substrate, the support layer SCF may be sandwiched between the display substrate and the optical module layer, in this way, in a case that a user operates the display substrate, the support layer SCF can buffer the force of the display substrate, to avoid damage to the optical module layer 20 and the plurality of photosensitive sub-pixels SP, in this way, the integrity and reliability of the texture recognition module are improved.

For example, in some embodiments, as shown in FIG. 5B, in a direction perpendicular to the base substrate 10, a thickness $T_{SCF}$ of the support layer SCF may be from 200 microns to 500 microns, that is, a distance $T_{SCF}$ between the surface of the support layer SCF away from the base substrate 10 and the surface of the base substrate 10 close to the support layer SCF is from 200 microns to 500 microns, such as 250 microns, 300 microns, 350 microns or 400 microns.

For example, in some embodiments, a surface of the support layer SCF close to the base substrate has an adhesive layer (not shown in the figure) to bond with the optical module layer 20, for example, a thickness of the adhesive layer may be from 10 microns to 50 microns, such as 20 microns, 30 microns or 40 microns.

For example, in some embodiments, as shown in FIG. 5A, in a direction perpendicular to the base substrate 10, the edge of the support layer SCF is at least partially flush with the edge of the base substrate 10, for example, a portion of the edge of the support layer SCF is flush with the edge of the base substrate 10. That is, there is a plane perpendicular to the base substrate 10, so that the at least partially flush edge of the support layer SCF with the base substrate 10 may simultaneously be in contact with this plane.

For example, in FIG. 5A, a left edge and an upper edge of the support layer SCF are flush with the edge of the base substrate 10, that is, the edge of the side of the support layer SCF away from the chip-on-film COF is flush with the edge of the base substrate 10. A right edge and a lower edge of the support layer SCF are not flush with the edge of the base substrate 10, that is, the edge of the side of the support layer SCF close to the chip-on-film COF is not flush with the edge of the base substrate 10, at this time, the orthographic projections of the right edge and the lower edge of the support layer SCF on the base substrate 10 is located within the base substrate 10.

For example, in some embodiments, the material of the support layer SCF may be a material such as foam.

Figure 6A:
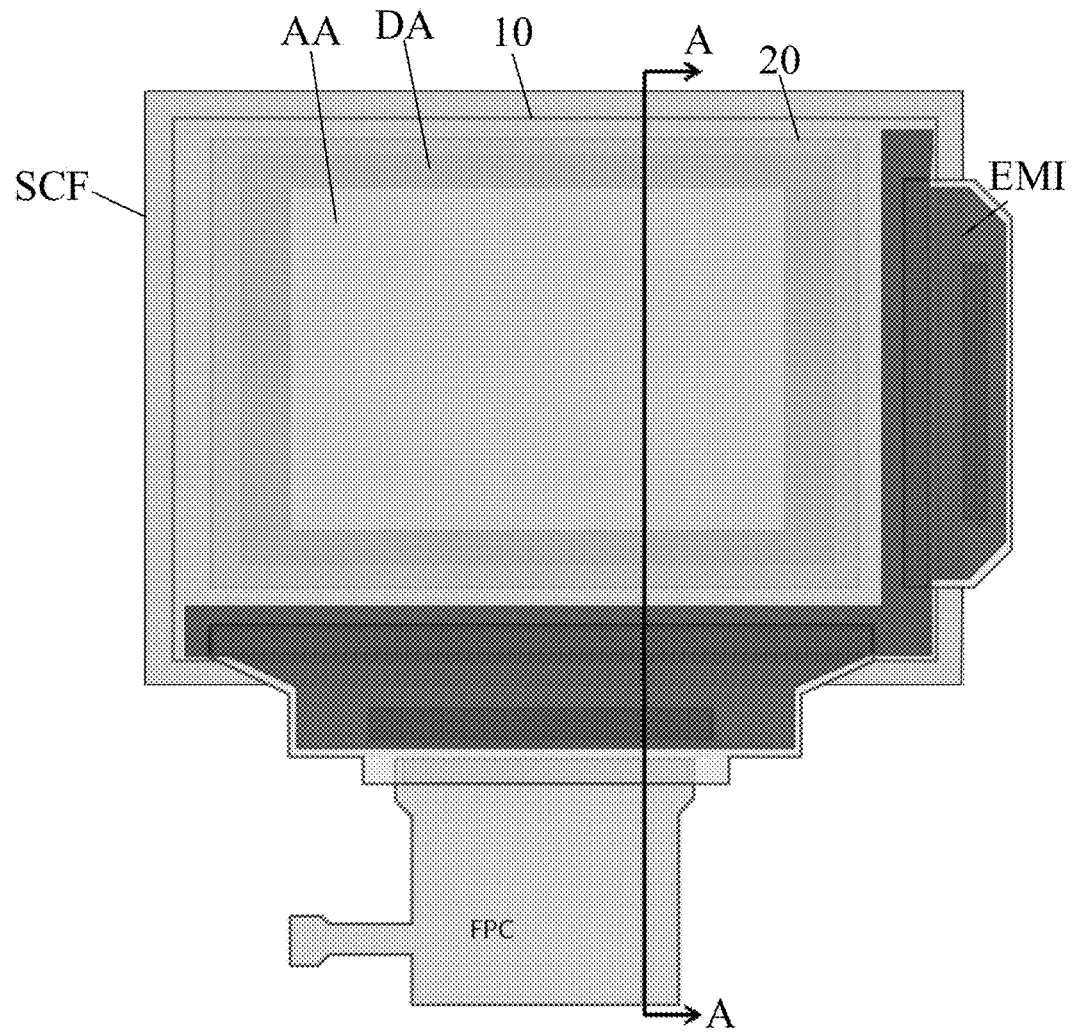
FIG. 6A is a planar schematic diagram of still another texture recognition module provided by at least one embodiment of the present disclosure.
Figure 6B:
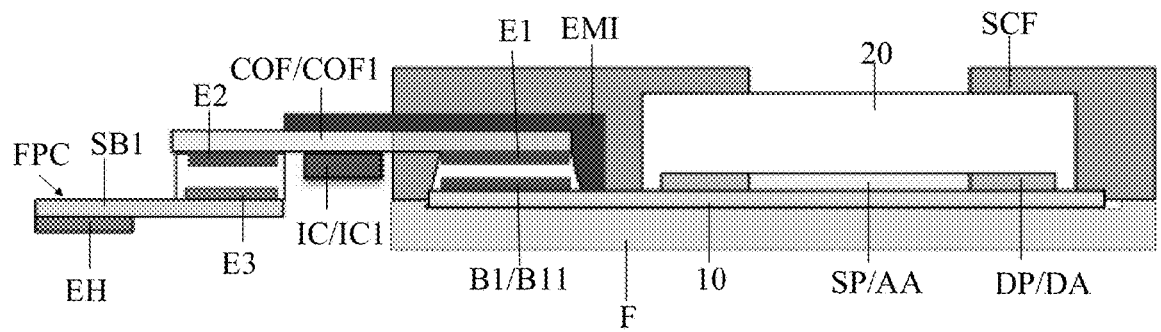
FIG. 6B is a cross-sectional schematic diagram along a line A-A of the texture recognition module in FIG. 6A.

Or, in some other embodiments, as shown in FIG. 6A and FIG. 6B (FIG. 6B is a cross-sectional schematic diagram of the texture recognition module in FIG. 6A along line A-A), the edge of the support layer SCF exceeds the edge of the base substrate 10, that is, the coverage range of the support layer SCF exceeds the base substrate 10, in this way, in a case that the texture recognition module is combined on the display substrate to form an electronic device, a middle frame F of the electronic device may be attached to the edge of the support layer SCF, to form a good combination and support, and the structural stability of the electronic device is improved; on the other hand, the texture acquisition region AA of the texture recognition module may be completely encapsulated in a groove of the middle frame F to prevent light from entering the optical module layer 20 from the side.

For example, in some embodiments, the distance of the support layer SCF beyond the base substrate 10 may be from 2.0 mm to 3.0 mm, such as 2.2 mm, 2.5 mm or 2.8 mm.

For example, in some embodiments, as shown in FIG. 5A, the electromagnetic shielding layer EMI is separated from the support layer SCF, to avoid mutual influence between the electromagnetic shielding layer EMI and the support layer SCF.

For example, a cutting dimension tolerance of the support layer SCF in the length direction of the base substrate 10 is $\pm\delta_{H\text{-}SCF}$, a cutting dimension tolerance in the width direction of the base substrate 10 is $\pm\delta_{V\text{-}SCF}$, $\delta_{H\text{-}SCF}=\delta_{V\text{-}SCF}=\delta3$; an attachment position tolerance of the support layer SCF in the length direction of the base substrate 10 is $\pm\Delta_{H\text{-}SCF}$, an attachment position tolerance in the width direction of the base substrate 10 is $\pm\Delta_{V\text{-}SCF}$, $\Delta_{H\text{-}SCF}=\Delta_{V\text{-}SCF}=\Delta3$; a spacing distance between the electromagnetic shielding layer EMI and the support layer SCF in the length direction of the base substrate 10 is $\text{Gap}_{SCF\text{-}H}$, the spacing distance between the electromagnetic shielding layer EMI and the support layer SCF in the width direction of the base substrate 10 is $\text{Gap}_{SCF\text{-}V}$, and the $\text{Gap}_{SCF\text{-}H}$ is substantially the same as the $\text{Gap}_{SCF\text{-}V}$.

For example, the spacing distance between the electromagnetic shielding layer EMI and the support layer SCF is $\text{Gap}_{SCF}$, $\text{Gap}_{SCF}=\text{Gap}_{SCF\text{-}H}=\text{Gap}_{SCF\text{-}V}$, and:

$$\text{Gap}_{SCF} \geq \sqrt{\delta 2^2 + \triangle 2^2 + \delta 3^2 + \triangle 3^2}.$$

For example, in some embodiments, ranges of 83 and 43 are from 0.05 mm to 0.50 mm respectively, such as 0.10 mm, 0.20 mm, 0.30 mm or 0.40 mm and so on.

In this way, it can be ensured that the electromagnetic shielding layer EMI and the support layer SCF have a sufficient separation distance, to cause the electromagnetic shielding layer EMI to overlap with the support layer SCF due to dimensional errors and alignment errors during the manufacturing process.

Figure 7A:
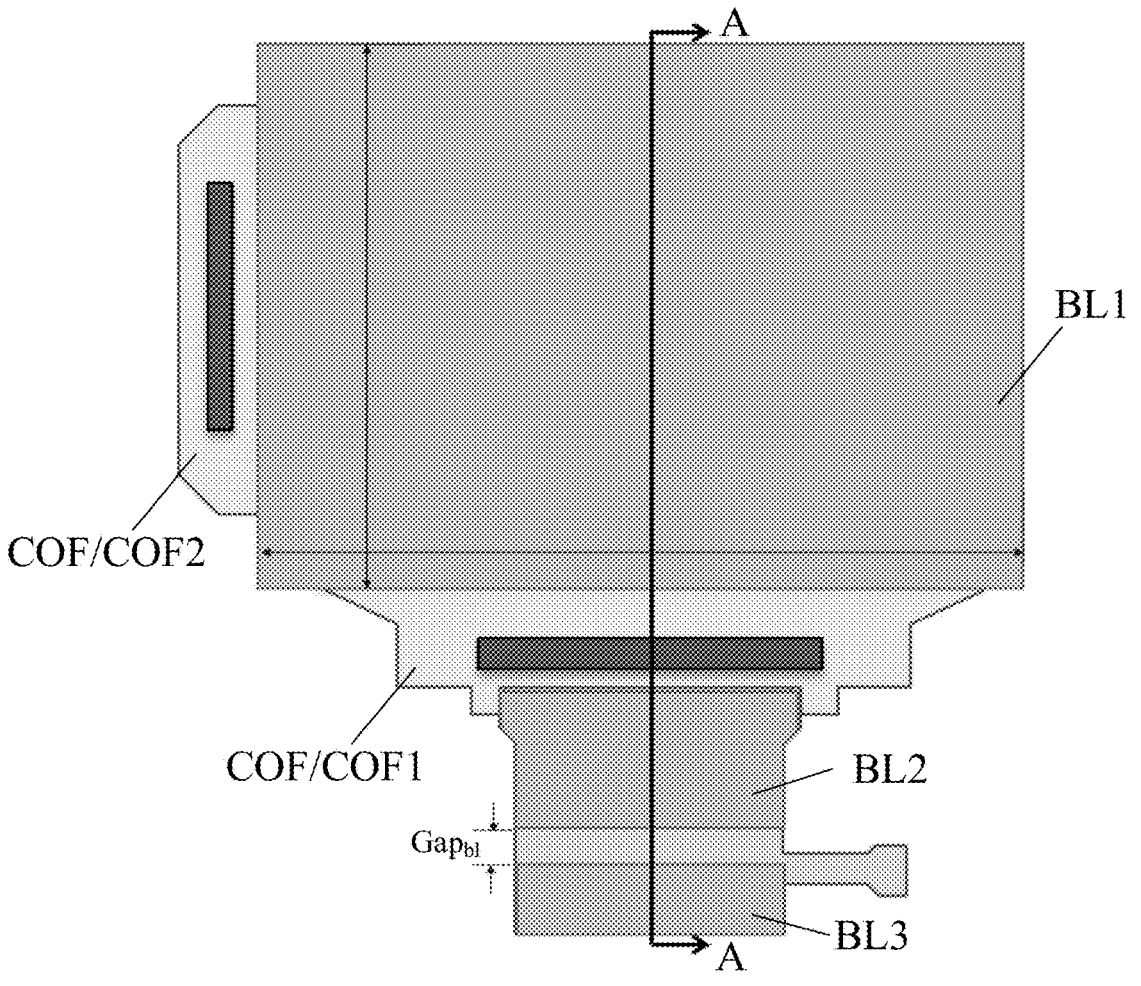
FIG. 7A is a planar schematic diagram of still another texture recognition module provided by at least one embodiment of the present disclosure.
Figure 7B:
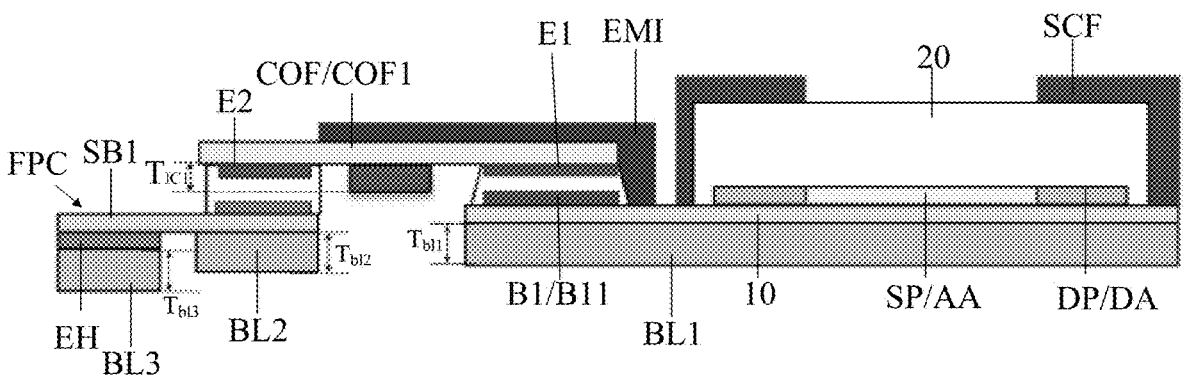
FIG. 7B is a cross-sectional schematic diagram along a line A-A of the texture recognition module in FIG. 7A.

For example, FIG. 7A shows a planar schematic diagram of another texture recognition module provided by at least one embodiment of the present disclosure, and FIG. 7B shows a schematic diagram of the cross-section of the texture recognition module in FIG. 7A along line A-A. As shown in FIG. 7A and FIG. 7B, in some embodiments, the texture recognition module may further include a first adhesive layer BL1 arranged on a side of the base substrate 10 away from the plurality of photosensitive sub-pixels SP. The first adhesive layer BL1 can provide a buffer effect and a bonding effect for the bottom of the base substrate 10, in addition, the first adhesive layer BL1 may also shield the bottom surface of the texture acquisition region AA and the dummy sub-pixel region DA, to avoid after a combination of the texture recognition module and the display substrate, a surface of the arranged middle frame F reflects light and the reflected light is reflected among various film layers of the texture recognition module, so that the light leakage signal is collected in the texture acquisition region AA, which affects the normal texture recognition work.

For example, as shown in FIG. 7A and FIG. 7B, in a direction perpendicular to the base substrate 10, at least a portion of the edge of the first adhesive layer BL1 is flush with the edge of the base substrate 10. For example, in some examples, all the edges of the first adhesive layer BL1 (for example, the upper, lower, left and right edges in FIG. 7A) are substantially flush with the edges of the base substrate 10. In this way, buffering, bonding and shielding effects can be fully realized.

Figure 8A:
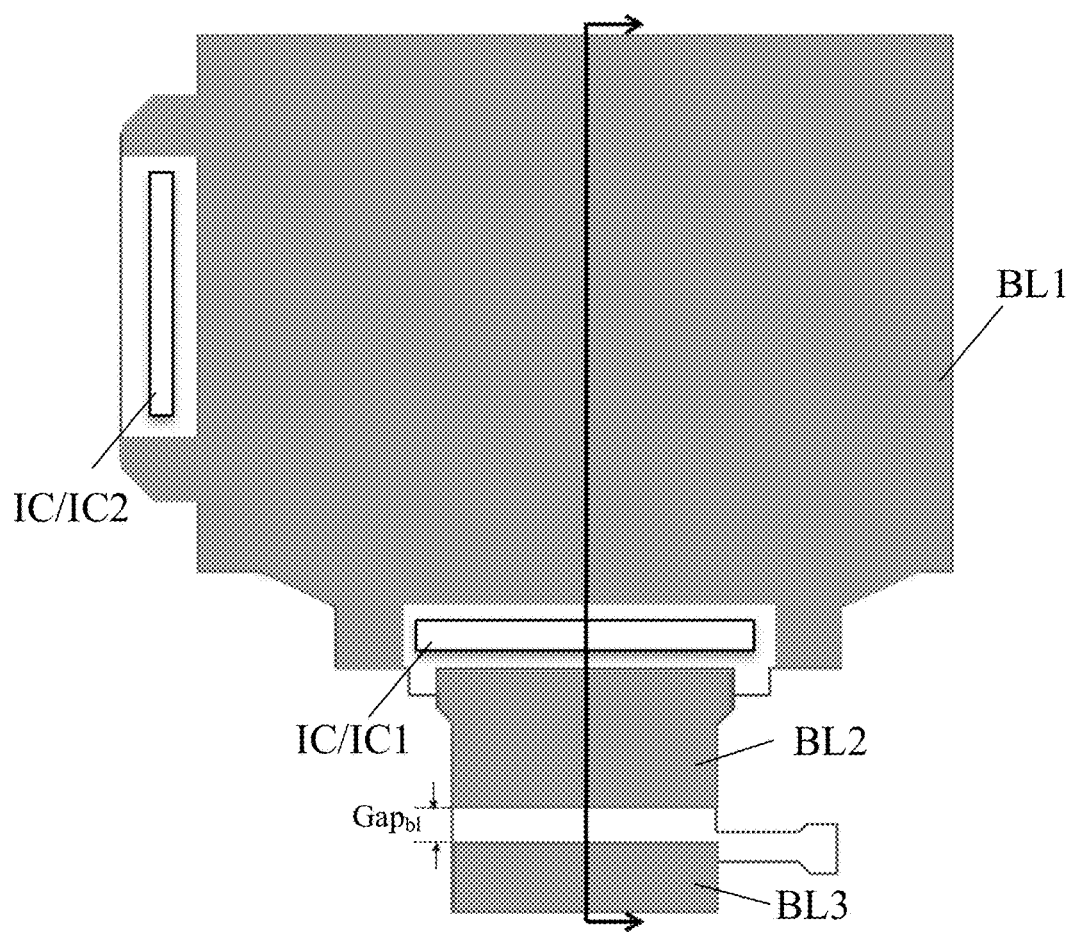
FIG. 8A is a planar schematic diagram of still another texture recognition module provided by at least one embodiment of the present disclosure.
Figure 8B:
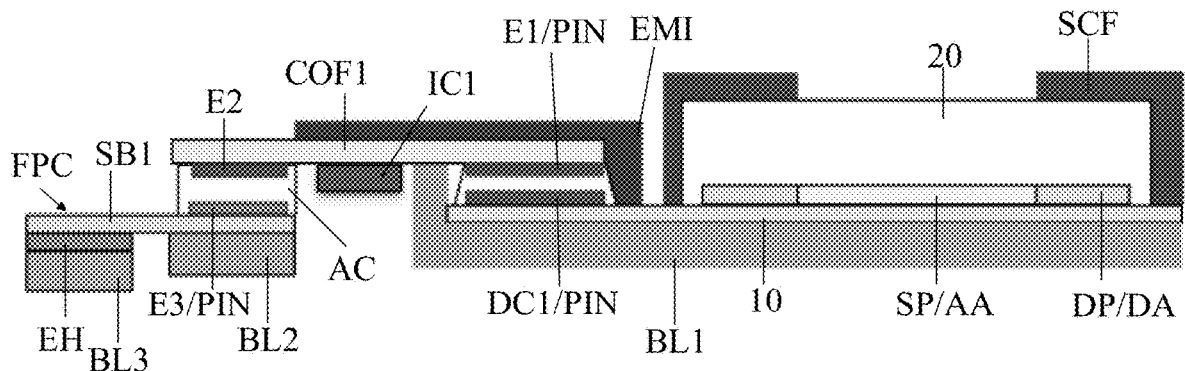
FIG. 8B is a cross-sectional schematic diagram along a line A-A of the texture recognition module in FIG. 8A.

For example, in other embodiments, as shown in FIG. 8A and FIG. 8B (FIG. 8B is a cross-sectional schematic diagram of the texture recognition module in FIG. 8A along line A-A), the first adhesive layer BL1 may also extend to an edge of the chip-on-film COF, to at least partially surround the control chip IC, FIG. 8A shows that a control chip IC is surrounded at three side surfaces of the control chip IC, to provide a buffering effect, bonding effect around the control chip IC.

For example, in some embodiments, as shown in FIG. 8B, the texture recognition module further includes a circuit board FPC, the circuit board FPC is, for example, a flexible circuit board, and the circuit board FPC has a third bonding end E3, the third bonding end E3 is bonded to the second bonding end E2 of the reading circuit chip-on-chip film COF1 opposite to the first bonding end E1. For example, a conductive adhesive AC, such as anisotropic conductive film (ACF), is provided between the third bonding end E3 and the second bonding end E2, to achieve a stable electrical connection between the third bonding end E3 and the second bonding end E2.

For example, as shown in FIG. 8B, the first circuit bonding region DC1 includes a bonding pin PIN, the bonding pin PIN of the first bonding end E1 of the reading circuit chip-on-film COF1 is bonded to the bonding pin PIN of the first circuit bonding region DC1 through, for example, the conductive adhesive. As shown in FIG. 8B, the circuit board FPC includes a first substrate BS1, the third bonding end E3 includes the bonding pin PIN arranged on the first substrate BS1, the bonding pin PIN of the second bonding end E2 of the reading circuit chip-on-film COF1 is bonded to the bonding pin PIN of the third bonding end E3 of the circuit board FPC through, for example, the conductive adhesive.

For example, the texture recognition module further includes a second adhesive layer BL2 arranged on the side of the first substrate BS1 away from the bonding pin PIN, in the direction perpendicular to the first substrate BS1, that is, the vertical direction in the figure, the bonding pin PIN of the third bonding end E3 is at least partially overlapped with the second adhesive layer BL2. In this way, the second adhesive layer BL2 can provide buffering effect and bonding effect on the third bonding end E3 of the circuit board FPC.

For example, in the direction perpendicular to the base substrate 10, at least a portion of the edge of the second adhesive layer BL2 are flush with the edge of the circuit board FPC, for example, in the embodiment of FIG. 8A, the left side edge and the right side edge of the second adhesive layer BL2 are flush with the edge of the circuit board FPC. For example, in the embodiment of FIG. 8A, the upper side edge of the second adhesive layer BL2 is spaced apart from the upper side edge of the circuit board FPC, in other embodiments, the upper side edge of the second adhesive layer BL2 may also be flush with the upper side edge of the circuit board FPC.

For example, in some embodiments, the circuit board FPC further includes a reinforcing sheet EH arranged on a side of the first substrate BS1 away from the bonding pin PIN and at the edge of the circuit board FPC, and a third adhesive layer BL3 arranged on a side of the reinforcing sheet EH away from the first substrate BS1. For example, the reinforcing sheet EH may be a metal sheet or an alloy sheet with a certain strength such as a steel sheet, to maintain the edge shape of the circuit board FPC. The third adhesive layer BL3 can provide cushioning effect and bonding effect on the edge of the circuit board FPC.

For example, as shown in FIG. 8A and FIG. 8B, in some embodiments, in a direction perpendicular to the base substrate 10, at least a portion of the edge of the third adhesive layer BL3 (for example, all of the edge, such as the upper side edge, the lower side edge, the left side edge and the right side edge in FIG. 8A) are flush with the edge of the reinforcing sheet EH, so that the cushioning effect and bonding effect are fully provided at the bottom of the reinforcing sheet EH. For example, at least a portion of the edges of the second adhesive layer BL2 and the third adhesive layer BL3 are flush with the edge of the circuit board FPC, to fully provide the cushioning effect and bonding effect for the edge of the circuit board FPC.

For example, as shown in FIG. 8A, a gap $\text{Gap}_{b1}$ is provided between the second adhesive layer BL2 and the third adhesive layer BL3, and the gap $\text{Gap}_{b1}$ is greater than or equal to 2 mm, such as 2.5 mm or 3.0 mm. Since the distance between the second adhesive layer BL2 and the first substrate BL1 is different from the distance between the third adhesive layer BL3 and the first substrate BL1, the second adhesive layer BL2 and the third adhesive layer BL3 have a sufficient distance to avoid structural instability caused by the connection between the second adhesive layer BL2 and the third adhesive layer BL3.

For example, in some embodiments, as shown in FIG. 7B, in a direction perpendicular to the first substrate BS1, a thickness $T_{b11}$ of the first adhesive layer BL1, a thickness $T_{b12}$ of the second adhesive layer BL2 and a thickness $T_{b13}$ of the third adhesive layer BL3 may be from 50 microns to 500 microns respectively, such as 100 microns, 150 microns, 200 microns, 300 microns or 400 microns and so on. For example, the thickness Toll of the first adhesive layer BL1, the thickness $T_{b12}$ of the second adhesive layer BL2, and the thickness of the third adhesive layer BL3 may be the same or different from each other.

For example, the two opposite sides of the first adhesive layer BL1, the second adhesive layer BL2 and the third adhesive layer BL3 have adhesive layers (not shown in the figure), so as to fix the texture recognition module with the middle frame F and other structures. A thickness of each of the adhesive layers may be from 10 microns to 50 microns, such as 20 microns, 30 microns, or 40 microns and so on.

For example, in some embodiments, the first adhesive layer BL1, the second adhesive layer BL2 and the third adhesive layer BL3 may use black double-sided adhesive, to improve the light-shielding effect. For example, the black double-sided adhesive may be made of acrylic adhesive. The materials of the first adhesive layer BL1, the second adhesive layer BL2 and the third adhesive layer BL3 may be the same or different.

Figure 9A:
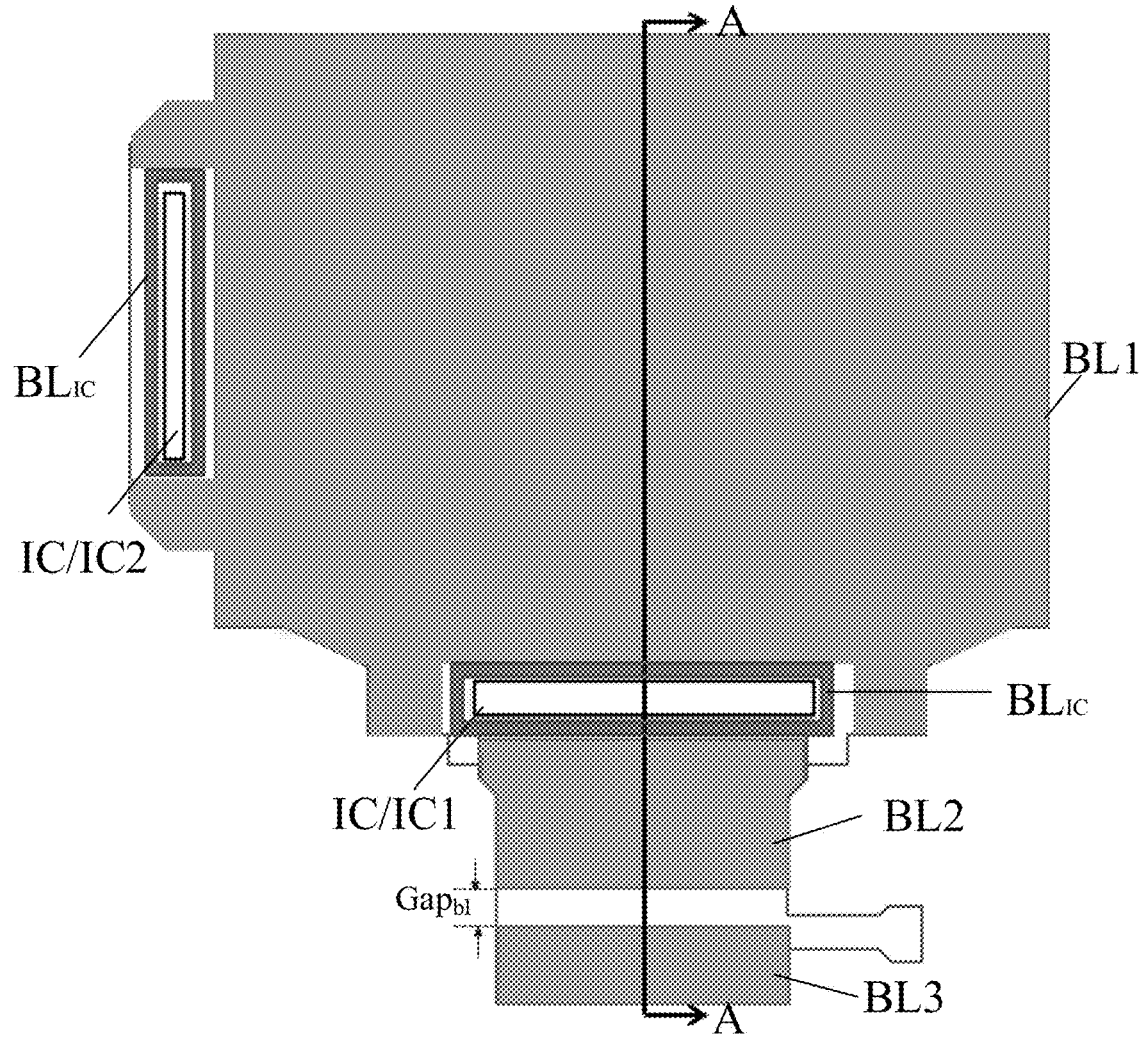
FIG. 9A is a planar schematic diagram of still another texture recognition module provided by at least one embodiment of the present disclosure.
Figure 9B:
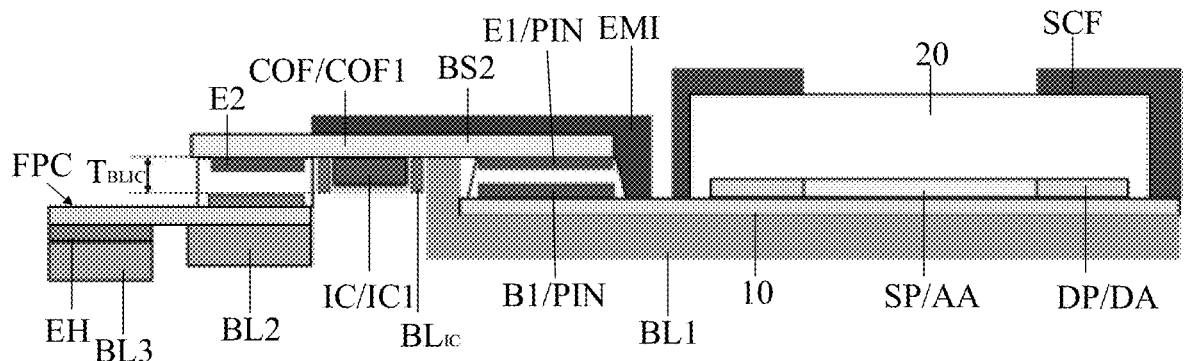
FIG. 9B is a cross-sectional schematic diagram along a line A-A of the texture recognition module in FIG. 9A.

For example, in some other embodiments, FIG. 9A shows a planar schematic diagram of another texture recognition module provided by at least one embodiment of the present disclosure, and FIG. 9B shows a schematic diagram of the cross-section of the texture recognition module in FIG. 8A along line A-A. As shown in FIG. 9A and FIG. 9B, in some embodiments, the reading circuit chip-on-film COF1 includes a second substrate BS2, a reading circuit control chip IC1 and a chip supporting layer $BL_{IC}$; the reading circuit control chip IC1 is arranged on the second substrate BS2 and located between the first bonding end E1 and the second bonding end E2, that is, between the bonding pins PIN of the first bonding end E1 and the second bonding end E2. The chip supporting layer $BL_{IC}$ is arranged on the second substrate BS2 and at least partially surrounds (for example, completely surrounds) the reading circuit control chip IC1. In this way, the chip supporting layer BLIC can provide support effect around the reading circuit control chip IC1, to avoid damage to the reading circuit control chip IC1 when a force is applied under the texture recognition module.

For example, in some embodiments, a first height $T_{BLIC}$ of the chip supporting layer $BL_{IC}$ relative to the second substrate BS2 is greater than a second height $T_{IC1}$ of the reading circuit control chip IC1 relative to the second substrate BS2 (referring to FIG. 7B), and a difference between the first height $T_{BLIC}$ and the second height $T_{IC1}$ is from 50 microns to 200 microns, such as 80 microns, 100 microns or 150 microns and so on. That is, the chip supporting layer BLIC protrudes from the reading circuit control chip IC1, to provide sufficient support.

For example, the material of the chip supporting layer $BL_{IC}$ may be foam or the like.

To sum up, in the embodiments of the present disclosure, the electromagnetic shielding film EMI is arranged above the chip-on-film COF, which is used to shield an electrical signal, for example, a line scan frequency, on the display substrate combined with the texture recognition module, to avoid horizontal stripe noise interference to the line scan frequency of the texture recognition module; on the other hand, the support layer SCF arranged on the optical module layer 20 surrounds the texture acquisition region, which is used to shield the dummy sub-pixels to prevent light leakage, and keep a certain distance between the surface of the optical module layer 20 and the back surface of the display substrate, to prevent a structure such as a lens structure of the surface of the optical module layer 20 from being damaged by collision of the back surface of the display substrate in a case that the display substrate is pressed with a large force; on the other hand, the bottom of the texture recognition module is provided with a bottom adhesive layer (that is, the first adhesive layer, second adhesive layer and third adhesive layer mentioned above), and the bottom adhesive layer is located on a side of a non-acquisition surface of the texture recognition substrate, and is used for bonding and fixing the texture recognition module and the surface of the middle frame of the electronic device, and the bottom adhesive layer shields the texture acquisition region of the texture recognition module and the back surface of the dummy sub-pixel region, to prevent the reflected light from the surface of the middle frame of the electronic product from being reflected among the film layers of the texture recognition module, resulting in the light leakage signal received by the texture acquisition region and affecting the texture recognition effect.

Figure 10:
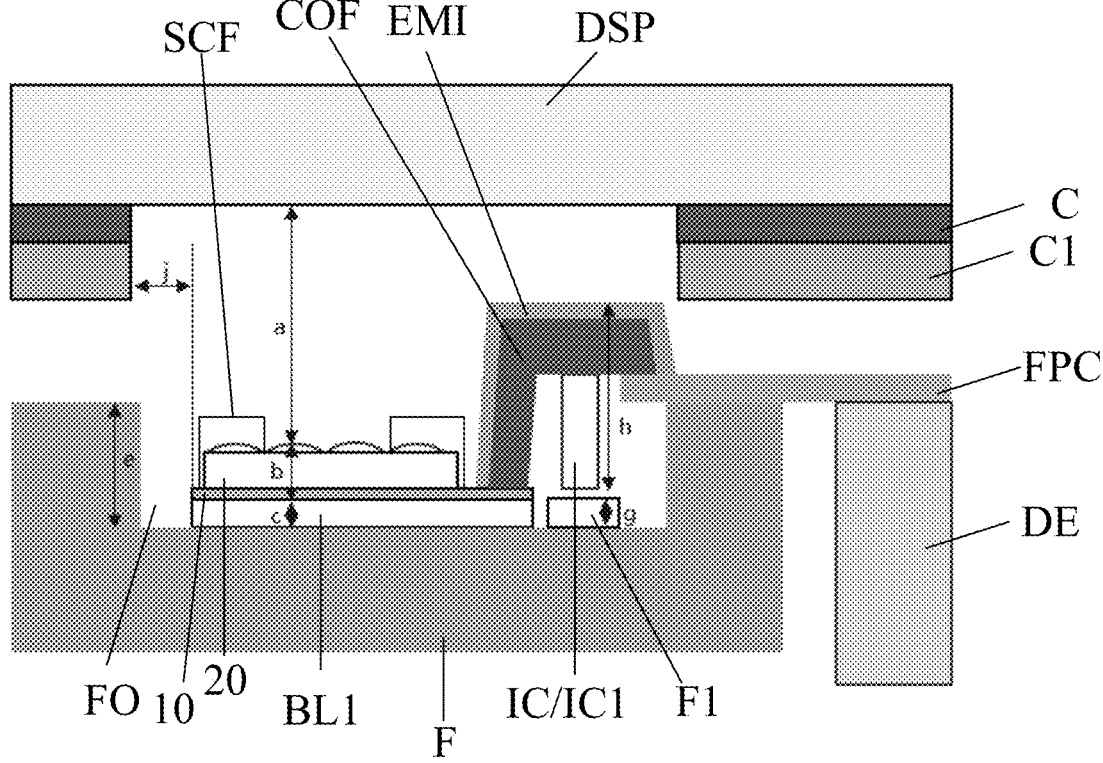
FIG. 10 is a partial cross-sectional schematic diagram of a display device provided by at least one embodiment of the present disclosure.

At least one embodiment of the present disclosure further provides a display device, and FIG. 10 shows a partial cross-sectional schematic diagram of the display device. As shown in FIG. 10, the display device includes the texture recognition module and the display substrate DSP provided by the embodiment of the present disclosure, and the display substrate DSP is arranged on a side of the support layer SCF of the texture recognition module away from the base substrate 10.

For example, as shown in FIG. 10, the display device further includes a middle frame F, the middle frame F is arranged on the side of the base substrate 10 of the texture recognition module away from the support layer SCF. For example, the middle frame F has a groove structure FO, at least the base substrate 10 of the texture recognition module and the structures on the base substrate 10, such as the texture acquisition region AA is arranged in the groove structure FO. For example, structures such as the chip-on-film COF may extend out of the middle frame F through bending.

For example, as shown in FIG. 10, in some embodiments, a gap a is provided between the display substrate and the texture recognition module, and the gap a is about 330 microns; a thickness of the texture recognition module (from the bottom surface of the base substrate 10 to the top surface of the optical module layer 20) is about 115 microns; a thickness c of the first adhesive layer BL1 is about 100 microns; a depth e of the groove structure FO of the middle frame F is about 200 microns; the bottom of the middle frame F is provided with a buffer structure (such as foam) F1, and a thickness of the buffer structure F1 is about 100 microns; for example, a thickness h from the electromagnetic shielding layer EMI to the control chip IC1 (a distance from the top surface of the electromagnetic shielding layer EMI to the bottom surface of the control chip IC1) is about 335 microns; a side of the display substrate close to the middle frame F also has support layers C and C1, a distance j between the support layers C and C1 and the texture recognition module is about 800 microns. For example, in some examples, the support layer C may be a graphite layer, and the support layer C1 may be a copper foil layer.

For example, as shown in FIG. 10, in some embodiments, the other end of the circuit board FPC may be connected with the device DE, for example, the device DE may be a control module of the display substrate.

The above-mentioned display device provided by the embodiments of the present disclosure can have a more accurate and faster texture recognition function while realizing display, and the display substrate and the texture recognition module can be stably combined under a condition that a thickness is thinner, so that the thinner design of the display device can be realized at the same time.

The following points required to be explained:

(1) the drawings of the embodiments of the present disclosure only relate to the structures related to the embodiments of the present disclosure, and other structures may refer to the general design.

(2) for the sake of clarity, in the drawings used to describe the embodiments of the present disclosure, the thickness of layers or areas is enlarged or reduced, that is, the drawings are not drawn according to the actual scale. It is understood that in the case that an element such as a layer, film, region, or substrate is referred to as being "up" or "down" on another element, the element may be "directly" on "or" down "on another element or there may be intermediate elements.

(3) without conflict, the embodiments of the present disclosure and the features in the embodiments may be combined with each other to obtain new embodiments.

What are described above is related to only the illustrative embodiments of the present disclosure and not limitative to the protection scope of the present application. Therefore, the protection scope of the present application shall be defined by the accompanying claims.

What is claimed is:

1. A texture recognition module, comprising a texture recognition substrate, wherein the texture recognition substrate comprises a texture acquisition region and a peripheral region at least partially surrounding the texture acquisition region, and the texture recognition substrate comprises:

a base substrate, a plurality of photosensitive sub-pixels, arranged on the base substrate, and located in the texture acquisition region, wherein each of the plurality of photosensitive sub-pixels comprises a photosensitive element, being used for texture acquisition, an optical module layer, arranged on a side of the plurality of photosensitive sub-pixels away from the base substrate, and configured to adjust light transmission, and a support layer, arranged on a side of the optical module layer away from the base substrate, comprising an acquisition opening, wherein the acquisition opening exposes the plurality of photosensitive sub-pixels, wherein a cutting dimension tolerance of the optical module layer in a length direction of the base substrate is $\pm\delta_{H\text{-}lens}$, and a cutting dimension tolerance in a width direction of the base substrate is $\pm\delta_{V\text{-}lens}$, $\delta_{H\text{-}lens}=\delta_{V\text{-}lens}=\delta 1$;

an attachment position tolerance of the optical module layer in the length direction of the base substrate is $\pm\Delta_{H\text{-}lens}$, and an attachment position tolerance of the optical module layer in the width direction of the base substrate is $\pm\Delta_{V\text{-}lens}$, $\Delta_{H\text{-}lens}=\Delta_{V\text{-}lens}=\Delta 1$, and a distance between an edge of an orthographic projection of the dummy sub-pixel region on the base substrate and an edge of the orthographic projection of the optical module layer on the base substrate is $OL_{lens}$, then:

20

$$OL_{lens} \geq \sqrt{\delta 1^2 + \triangle 1^2}.$$

2. The texture recognition module according to claim 1, wherein the peripheral region comprises a dummy sub-pixel region at least partially surrounding the texture acquisition region, the texture recognition substrate further comprises a plurality of dummy sub-pixels arranged on the base substrate and located in the dummy sub-pixel region, wherein orthographic projections of the plurality of dummy sub-pixels on the base substrate are located within an orthographic projection of the support layer on the base substrate.

3. The texture recognition module according to claim 2, wherein the orthographic projections of the plurality of dummy sub-pixels on the base substrate are located within an orthographic projection of the optical module layer on the base substrate.

4. The texture recognition module according to claim 2, wherein the peripheral region further comprises a circuit bonding region located on a side of the dummy sub-pixel region away from the texture acquisition region, the texture recognition module further comprises:

a chip-on-film, comprising a first bonding end, wherein the first bonding end is bonded to the circuit bonding region, and an electromagnetic shielding layer, arranged on a side of the chip-on-film far away from the base substrate, wherein an orthographic projection of at least the first bonding end of the chip-on-film on the base substrate is located within an orthographic projection of the electromagnetic shielding layer on the base substrate.

5. The texture recognition module according to claim 4, wherein the circuit bonding region comprises a first circuit bonding region located on a first side of the dummy sub-pixel region and a second circuit bonding region located on a second side of the dummy sub-pixel region, the chip-on-film comprises a scanning driving chip-on-film and a reading circuit chip-on-film, a first bonding end of the reading circuit chip-on-film is bonded to the first circuit bonding region, and a first bonding end of the scanning driving chip-on-film is bonded to the second circuit bonding region.

6. The texture recognition module according to claim 5, further comprising:

a circuit board, comprising a third bonding end, wherein the third bonding end is bonded to a second bonding end of the reading circuit chip-on-film opposite to the first bonding end, wherein the circuit board comprises a first substrate, and the third bonding end comprises a bonding pin arranged on the first substrate;

the texture recognition module further comprises a second adhesive layer arranged on a side of the first substrate away from the bonding pin, and in a direction perpendicular to the first substrate, the bonding pin is at least partially overlapped with the second adhesive layer.

7. The texture recognition module according to claim 6, wherein the circuit board further comprises a reinforcing sheet that is arranged on a side of the first substrate away from the bonding pin and located at an edge of the circuit board and a third adhesive layer arranged on a side of the reinforcing sheet away from the first substrate, wherein at least a portion of an edge of the third adhesive layer is flush with an edge of the reinforcing sheet, wherein a gap is provided between the second adhesive layer and the third adhesive layer, and a distance of the gap is greater than or equal to 2 mm, wherein in a direction perpendicular to the first substrate, a thickness of the second adhesive layer and a thickness of the third adhesive layer are from 50 microns to 500 microns respectively.

8. The texture recognition module according to claim 6, wherein the reading circuit chip-on-film comprises:

a second substrate, a reading circuit control chip, arranged on the second substrate and located between the first bonding end and the second bonding end, a chip supporting layer, arranged on the second substrate and at least partially surrounding the readout circuit control chip.

9. The texture recognition module according to claim 8, wherein a first height of the chip supporting layer relative to the second substrate is greater than a second height of the reading circuit control chip relative to the second substrate, and a difference between the first height and the second height is from 50 microns to 200 microns.

10. The texture recognition module according to claim 4, wherein a gap is provided between an edge of the electromagnetic shielding layer and an edge of the base substrate adjacent to the electromagnetic shielding layer, wherein a cutting dimension tolerance of the electromagnetic shielding layer in a length direction of the base substrate is $\pm\delta_{H\text{-}EMI}$, the cutting dimension tolerance in a width direction of the base substrate is $\pm\delta_{H\text{-}EMI}$, $\delta_{H\text{-}EMI}=\delta_{V\text{-}EMI}=\delta 2$;

an attachment position tolerance of the electromagnetic shielding layer in the length direction of the base substrate is $\pm\Delta_{H\text{-}EMI}$, an attachment position tolerance in the width direction of the base substrate is $\pm\Delta_{V\text{-}EMI}$, $\Delta_{H\text{-}EMI}=\Delta_{V\text{-}EMI}=\Delta 2$;

a distance between an edge of the electromagnetic shielding layer and an edge of the adjacent base substrate in the length direction and the width direction is $OL_{EMI}$ respectively, then $$OL_{EMI} \geqslant \sqrt{\delta 2^2 + \triangle 2^2}.$$

11. The texture recognition module according to claim 4, wherein at least a portion of an edge of the electromagnetic shielding layer is flush with an edge of the base substrate, wherein a gap is provided between the electromagnetic shielding layer and the adjacent optical module layer, and a distance of the gap is $Gap_{EMI}$, then:

$$Gap_{EMI} \geqslant \sqrt{\delta 1^2 + \triangle 1^2 + \delta 2^2 + \triangle 2^2}.$$

12. The texture recognition module according to claim 4, wherein in a direction perpendicular to the base substrate, a thickness of the electromagnetic shielding layer is 10 microns to 50 microns.

13. The texture recognition module according to claim 4, wherein a gap is provided between the electromagnetic shielding layer and the support layer, wherein a cutting dimension tolerance of the support layer in a length direction of the base substrate is $\pm\delta_{H\text{-}SCF}$, a cutting dimension tolerance of the support layer in a width direction of the base substrate is $\pm\delta_{V\text{-}SCF}$, $\delta_{H\text{-}SCF}=\delta_{V\text{-}SCF}=\delta 3$;

an attachment position tolerance of the support layer in the length direction of the base substrate is $\pm\Delta_{H\text{-}SCF}$, an attachment position tolerance of the support layer in the width direction of the base substrate is $\pm\Delta_{V\text{-}SCF}$, $\Delta_{H\text{-}SCF}=\Delta_{V\text{-}SCF}=\Delta 3$; and a distance of a gap between the electromagnetic shielding layer and the support layer is $Gap_{SCF}$, then:

$$Gap_{SCF} \geqslant \sqrt{\delta 2^2 + \triangle 2^2 + \delta 3^2 + \triangle 3^2}.$$

14. The texture recognition module according to claim 4, further comprising:

a first adhesive layer, arranged on a side of the base substrate away from the plurality of photosensitive sub-pixels, wherein at least a portion of an edge of the first adhesive layer is flush with an edge of the base substrate, wherein the chip-on-film comprises a control chip, the first adhesive layer further extends to an edge of the chip-on-film to at least partially surround the control chip.

15. The texture recognition module according to claim 1, wherein a total length of the texture acquisition region and the dummy sub-pixel region is $H_{AA+dummy}$, a total width of the texture acquisition region and the dummy sub-pixel region is $V_{AA+dummy}$, a length of the optical module layer is $H_{lens}$, and a width of the optical module layer is $V_{lens}$, then $$H_{lens} \geqslant H_{AA+dummy} + 2\sqrt{\delta 1^2 + \triangle 1^2},$$

$$V_{lens} \geqslant H_{AA+dummy} + 2\sqrt{\delta 1^2 + \triangle 1^2}.$$

16. The texture recognition module according to claim 1, wherein an edge of an orthographic projection of the optical module layer on the base substrate is located within an orthographic projection of the support layer on the base substrate, wherein in a direction perpendicular to the base substrate, the support layer has a thickness of 200 microns to 500 microns.

17. The texture recognition module according to claim 1, wherein an edge of the support layer is at least partially flush with an edge of the base substrate; or an edge of the support layer extends beyond an edge of the base substrate.

18. A display device, comprising:

a texture recognition module according to claim 1, and a display substrate, arranged on a side of the support layer of the texture recognition module away from the base substrate.

19. The display device according to claim 18, further comprising:

a middle frame, arranged on a side of the base substrate of the texture recognition module away from the support layer.

* * * * *